United States Patent
Wong et al.

Patent Number: 5,158,620
Date of Patent: * Oct. 27, 1992

[54] SUPERCONDUCTOR AND PROCESS OF MANUFACTURE

[75] Inventors: James Wong, Wayland; Mark K. Rudziak, Westminister; Donald W. Capone, II, Northbridge, all of Mass.

[73] Assignee: Composite Materials Technology, Inc., Shrewsbury, Mass.

[*] Notice: The portion of the term of this patent subsequent to Nov. 3, 2009 has been disclaimed.

[21] Appl. No.: 480,236

[22] Filed: Feb. 15, 1990

Related U.S. Application Data

[63] Continuation-in-part of Ser. No. 363,634, Jun. 8, 1989, Pat. No. 4,925,741.

[51] Int. Cl.$^5$ .............. C22C 1/18; H01L 39/12; H01L 39/24; H01B 12/02
[52] U.S. Cl. ............................ 148/96; 29/599; 505/918; 505/921
[58] Field of Search .......... 428/930, 660, 661, 662, 428/610, 614; 148/11.5 Q, 11.5 F; 29/599; 505/1, 812, 813, 919, 921, 814, 918

[56] References Cited

U.S. PATENT DOCUMENTS

| | | | |
|---|---|---|---|
| 3,465,430 | 9/1969 | Barber et al. | 505/915 |
| 3,534,459 | 10/1970 | Kudo et al. | 428/430 |
| 3,625,662 | 12/1971 | Roberts et al. | 29/191.6 |
| 3,652,967 | 3/1972 | Tanaka et al. | 29/599 |
| 3,665,595 | 5/1972 | Tanaka et al. | 29/599 |
| 3,728,165 | 4/1973 | Hewlett | 29/599 |
| 4,414,428 | 11/1983 | McDonald | 174/126 S |
| 4,803,310 | 2/1989 | Zeitlin | 174/128 S |
| 4,959,279 | 9/1990 | Tanaka et al. | 29/599 |
| 4,973,527 | 11/1990 | Smathers | 29/599 |

OTHER PUBLICATIONS

Restricted, Novel Heat Treatments for Obtaining High $J_c$ in Nb46.5 wt. % Ti P. J. Lee et al., Paper #HX-03 at ICMC/CEC, Los Angeles, Ca., Jul. 25, 1989.

Current Carrying Capacity of Superconductors with Artificial Pinning Centers, D. L. Dorofejev et al., Proceedings of 9th Int. Conf. on Magnet Tech., MT-9, Swiss Institute of Nuclear Tech., pp. 564–566, Zurich, 1985.

Properties of Superconducting NbTi Superfine Filament Composites with Diameters 0.1 μm, I Hiasnic et al., Cryogenics, vol. 25, Oct. 1985.

NbTi Superconductors with Artificial Pinning Structures, L. R. Motowidlo et al., Paper #HX-01 at ICMC/CEC, Los Angeles, Ca., Jul. 25, 1989.

*Primary Examiner*—John Zimmerman
*Attorney, Agent, or Firm*—Hayes, Soloway, Hennessey & Hage

[57] ABSTRACT

In the present invention, a superconductor is produced by the steps of wrapping a plurality of layers of metal sheets around a support to form a composite structure. The sheets are pure transition metals-13 niobium, titanium, zirconium, or vanadium, for example—alternate sheets being formed of different transition metals. The support may be composed of any ductile metal. The resulting composite structure is mechanically reduced sufficiently so that each transition metal sheet is less than 1000 Å thick. In the course of reduction, the composite is subjected to sufficient temperatures for sufficient times such that the transition metal layers are partially reacted to form a ductile superconducting material between the transition metal layers. Approximately one half by volume of the transition metal layers remain unreacted. These unreacted layers afford efficient flux pinning within the composite when the layers are reduced to the <1000 Å final size.

6 Claims, 4 Drawing Sheets

SUPERCONDUCTOR AND PROCESS OF MANUFACTURE

This application is, in part, a continuation of our application Ser. No. 07/363,634, filed Jun. 8, 1989, now U.S. Pat. No. 4,925,741, issued May 15, 1990.

BACKGROUND OF THE INVENTION

NbTi has long served as the backbone of the superconducting wire industry. Despite continued research into alternate materials, including the recent surge of interest in high-$T_c$ superconductors, NbTi remains the superconductor of choice. Unfortunately, high quality NbTi wire is difficult to produce, requiring a complicated and time-consuming schedule of heat treatments. A composite material with the promise for rendering such heat treatment schedules unnecessary is desirable.

While a number of heat treatment schedules can be and are currently employed in the production of NbTi conductors, their purpose is the same: to precipitate $\alpha$-Ti particles in the NbTi. These particles serve as defects capable of pinning flux lines. This pinning in turn allows high $J_c$'s to be achieved. The drawbacks to the heat treatment method of processing are numerous, but may be briefly summarized as follows:

1. The balance between the number and length of heat treatments, the pre-heat treatment strains and heat treatment temperatures is delicate. Hence, optimizing the $J_c$ is difficult, and is vulnerable to errors during the processing of the wire.
2. The need for complicated heat treatment schedules lengthens processing time substantially and increases production costs.
3. The presence of $\alpha$-Ti decreases the ductility of NbTi; this is manifested in difficulties in obtaining desired conductor piece lengths.
4. Extensive heat treatment introduces Ti-Cu compound formation problems that can only be avoided through the use of barrier materials.

It is well-known that $\alpha$-Ti precipitates in NbTi greatly enhance $J_c$ due to their ability to serve as flux pinning sites. These precipitates, which form at $\beta$-Nb-Ti grain boundaries, are generally created by a series of heat treatments separated by strain resulting from cold deformation. This strain encourages the $\alpha$-Ti precipitation. A final, larger strain occurs after the last heat treatment. The final strain elongates the $\alpha$-Ti and allows optimization of the $J_c$.

The particulars of the heat treatment schedule depend upon a number of factors: NbTi composition, homogeneity, etc. However, a typical schedule for the commonly used Nb46.5 wt % Ti will involve three or more 300° C.–450° C. treatments, 40–80 hours in duration separated by areal reductions of approximately 1.6. The final areal reduction is usually in the range of 7–12.

The best of these schedules produces about 20 volume percent of $\alpha$-Ti in the NbTi and $J_c$'s in excess of 3000 A/mm$^2$ at 5T and 4.2° K. In wires with these properties, the $\alpha$-Ti is configured in a dense array of ribbons 10–20A.° in thickness, 40–80A.° apart, and with the aspect ratio dependent upon the final strain imparted (see, for example, P. J. Lee, J. C. McKinnell, and D. C. Larbalestier, "Restricted Novel Heat Treatments for Obtaining High $J_c$ in Nb46.5 wt % Ti", To be published, presented as paper #HX-03 at ICMC/CEC, Los Angeles, Calif., Jul. 25, 1989).

Clearly, the heat treatment method of producing pinning sites is not only time consuming but is also open to potentially disastrous errors. If heat treatment times or temperatures are incorrect, or if too much or too little strain is applied, initially good material can be rendered useless A material that does not require such complicated processing and which reliably yields high $J_c$'s would thus be of tremendous value. Artificially pinned NbTi promises to be such a material.

Work performed several years ago by G. L. Dorofejev, E. Yu. Klimenko, and S. V. Frolov, ("Current-Carrying Capacity of Superconductors with Artificial Pinning Centers", Proceedings of the 9th International Conference on Magnet Technology, MT-9, Swiss Institute of Nuclear Technology, P. 564–6, Zurich, 1985, ISPN 3-907998-00-6,) demonstrated for the first time that transition metals could be utilized as pinning sites in NbTi. These investigators produced wires containing a Nb50 wt % Ti matrix surrounding up to $10^7$ mircofilaments of Nb, Ti, or V. The microfilament spacings were equal to the microfilament diameters. These composites were processed without heat treatment to a variety of sizes for $J_c$ testing. It was found that $J_c$ increased in inverse proportion to the microfilament diameter down to $\sim$500A.°. Below this size, mechanical and diffusional effects began to degrade the properties. The best of the composites, incorporating Nb filaments in the NbTi matrix, displayed a $J_c$ of 3500 A/mm$^2$ at 5T and 4.2° K.

In work performed by I. Hiasnik et al., ("Properties of Superconducting NbTi Superfine Filament Composites with Diameters $\sim$<0.1 $\mu$m", Cryogenics, vol. 25, October, 1985) Cu-NbTi composites consisting of 9,393,931 NbTi filaments embedded in Cu were fabricated via multiple restacks. No special heat treatments were employed during processing. NbTi filament diameters as low as 200A.° were achieved, along with Cu matrix thicknesses of $\sim$100A.°. FIG. 1 shows a plot of critical current density versus filament diameter for a Cu-NbTi composite at 5T and 4.2° K. The peak $J_c$ of approximately 3000 A/mm$^2$ occurs at $\sim$500 A.° filament diameter and is followed a rapid decline, consistent with the findings of Dorofejev et al.

Recent work by L. R. Motowidlo, H. C. Kanithi, and B. A. Zeitlin, ("NbTi Superconductors with Artificial Pinning Structures", To be published, presented as paper #HX-01 at ICMC/CEC, Los Angeles, Calif., Jul. 25, 1989, see also U.S. Pat. No. 4,803,310,) transposed the positions of the Nb and NbTi relative to the approach of Dorofejev et al., placing the NbTi within a Nb matrix. Employing multiple restacks, the investigators produced a multifilament wire containing 1250 filaments. Each of these copper clad filaments contained 5800 Nb46.5 wt % Ti cores within a Nb matrix. The Nb and NbTi occupied equal volume fractions within the filaments. By simply drawing the multifilament material down, the investigators achieved $J_c$'s as high as 3700 A/mm$^2$ in a 0.020" diameter wire at 4T and 4.2° K., corresponding to Nb and NbTi dimensions of about 150 A.° (matrix thickness) and 670 A.° (core diameter), respectively. A plot of $J_c$ versus applied field for several of the wire diameters tested is shown in FIG. 2. These data were taken at 4.2° K. using a standard four point probe and helically wound samples. The voltage taps were separated by 75 cm.

The remarkably good low field behavior found by the investigators is mitigated by the poor high field behavior $H_c2$ for the material was found to be only about 7.5T, well below that for conventionally processed material (11T). Nonetheless, the experiment clearly demonstrated transition metal pinning.

Older work by Roberts et al., U.S. Pat. No. 3,625,662, Dec. 7, 1971 and MacDonald, U.S. Pat. No. 4,414,428, Nov. 9, 1983, involved the fabrication of superconductors using layered sheet materials, but in neither case did the investigators contemplate the engineering of pinning mechanisms via the manipulation of superconducting and normal metals.

BRIEF DESCRIPTION OF THE INVENTION

In the present invention, a superconductor is produced by the steps of wrapping a plurality of layers of metal sheets around a support to form a composite structure. The sheets are pure transition metals — niobium, titanium, zirconium, or vanadium, for example — alternate sheets being formed of different transition metals. The support may be composed of any ductile metal. The resulting composite structure is mechanically reduced sufficiently so that each transition metal sheet is less than 1000 A.° thick. In the course of reduction, the composite is subjected to sufficient temperatures for sufficient times such that the transition metal layers are partially reacted to form a ductile superconducting material between the transition metal layers. Approximately one half by volume of the transition metal layers remain unreacted. These unreacted layers afford efficient flux pinning within the composite when the layers are reduced to the <1000 A.° final size.

The reaction of the transition metal layers should occur when said layers are greater than or equal to ~1 μm in thickness and can be brought about by any means appropriate, including but not limited to, hot isostatic pressing, hot extrusion, or heat treatment. By reacting the layers at a relatively large thickness, the reaction can be controlled so that the desired superconducting and normal layer dimensions can be obtained. By contrast, heat treatments applied at final size, when the layers are extremely thin, could not be controlled to the extent necessary to maintain unreacted material. That unreacted layers must be maintained distinguishes this invention from that of Roberts et al., where no such provision is made.

In order to more fully understand the invention, reference should be had to the following detailed description taken in conjunction with the attached drawings, wherein:

DETAILED DESCRIPTION OF THE INVENTION

In the present invention, sheets of pure transition metal are layered and then wrapped around a core. When this material is processed, small layer thicknesses are quickly and easily obtained. During processing, ductile superconducting material is formed at the interfaces of the layered sheets such that approximately one half of the sheet thicknesses remain unreacted. These unreacted layers of transition metal afford pinning within the composite when reduced to <1000 A.° thick. The presence of pinning sites in the composite allows the development of superior $J_c$ at low magnetic field (1T-5T). Here, a pinning site is defined as an interface between normal and superconducting material. In general, the greater the pinning site density within the composite, the better the low field $J_c$.

The thickness of the normal and superconducting layers is critical to the ultimate performance of the composite. If the layer thicknesses are too large, i.e., not on the order of the fluxoid spacing at the particular magnetic field, then inefficient pinning results. On the other hand, if the layers are reduced too much, mechanical and diffusional problems are introduced, as are proximity effects, serving to degrade the critical current density and upper critical field of the composite.

Figure 3:
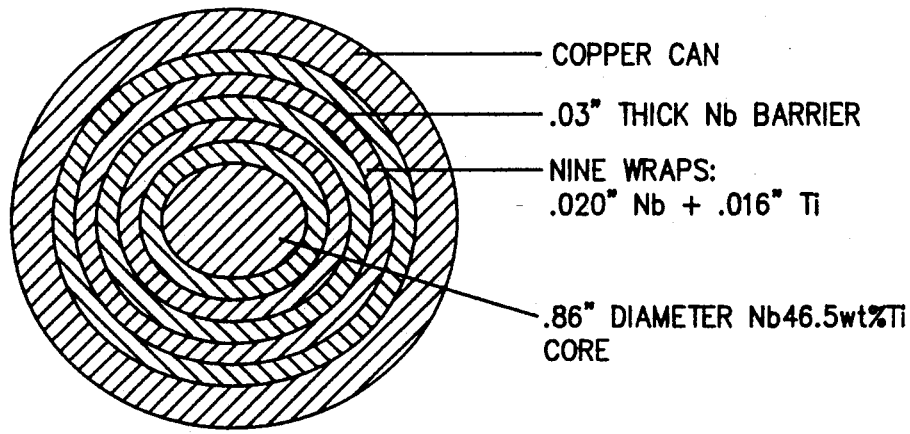
FIG. 3 shows the design of a monofilament billet containing alternating layers of Nb and Ti sheet wrapped around a Nb46.5 wt % Ti core.

According to the invention, a composite material utilizing alternating layers of transition metal was fabricated as described hereafter. The process began by constructing a copper clad monofilament billet containing alternating layers of Nb and Ti around a Nb46.5 wt % Ti core (see FIG. 3). Nb and Ti layers were chosen in the hope that the layers might be reacted at a later point in the processing. The layer thicknesses were selected so that after this reaction, thin layers of unreacted Nb and Ti would remain to act as pinning sites, while the rest of the material would be NbTi alloy. These considerations resulted in a Nb to Ti ratio of 5:4 by volume.

After assembly, the monofilament billet was electron-beam welded shut in vacuum and then hot isostatically pressed at 650° C. for four hours at a pressure of 15 ksi. The billet was then machined to 2.0" in diameter for extrusion. Prior to extrusion, the billet was heated to 650° C., which temperature was maintained for two hours. The billet was then extruded at 650° C. to 0.5" in diameter. The extruded rod was cold-drawn to 0.03" in diameter, at which point the copper jacket was removed and the material was restacked in a Nb lined copper can, the Nb here, as in the case of the monofilament, serving to prevent copper contamination of the material. The new billet thus produced contained almost 4000 filaments within a thin Nb matrix.

Figure 4:
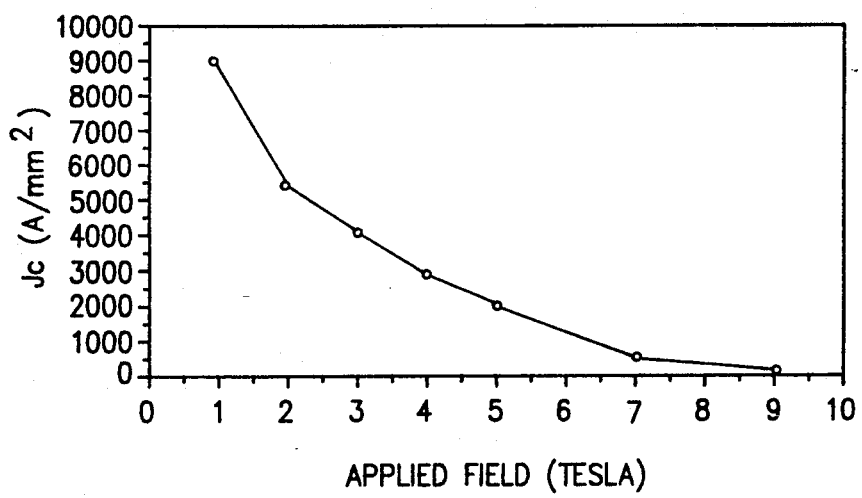
FIG. 4 shows a plot of current density versus applied magnetic field for a 0.0084" diameter Nb/Ti composite fabricated in accordance with the invention.

The restack billet was processed in just the same way as was the monofilament billet, ultimately being drawn to several wire sizes for $J_c$ testing. A standard four point probe was used to measure the $I_c$ of helically wound samples at 4.2° K. The voltage laps were spaced 22 cm apart. FIG. 4 shows a representative $J_c$ versus applied field curve for the non-heat treated Nb and Ti material. Indeed, although the plot is for a 0.0084" diameter wire, the data from the other samples tested (0.0297"–0.0045" diameter) fell very nearly on the same curve. The $J_c$'s were calculated over the filament and Nb matrix areas, excluding both the copper and the outer annulus of Nb that was included as insurance against copper contamination. This annulus, 0.045" thick at the 2.0" restack billet diameter, could easily be eliminated in future designs, and hence was not considered in the $J_c$.

As FIG. 4 shows, the product of the present invention displayed remarkably high $J_c$'s considering that only pure Nb and Ti sheets went into the bulk of the composite. The highest 5T $J_c$ measured was 2175 A/mm$^2$ for the 0.0084" diameter wire. $H_c2$ was estimated at 10.2T. Based on data acquired from a control material that contained only Nb46.5 wt % Ti cores in a Nb matrix, the NbTi core in the wrapped foils was eliminated from the $J_c$ calculations, allowing an estimate of $J_c$ within the Nb and Ti layers. For the 0.0084" wire at 5T and 4.2° K., the $J_c$ in this region was estimated at 3250 A/mm$^2$. That these current densities were achieved without special heat treatment implies that some alloying of the Nb and Ti layers must have occurred during processing. Since the processing of both the monofilament and restack billets involved hot isostatic pressing and hot extrusion, there was ample opportunity for NbTi formation.

Figure 1:
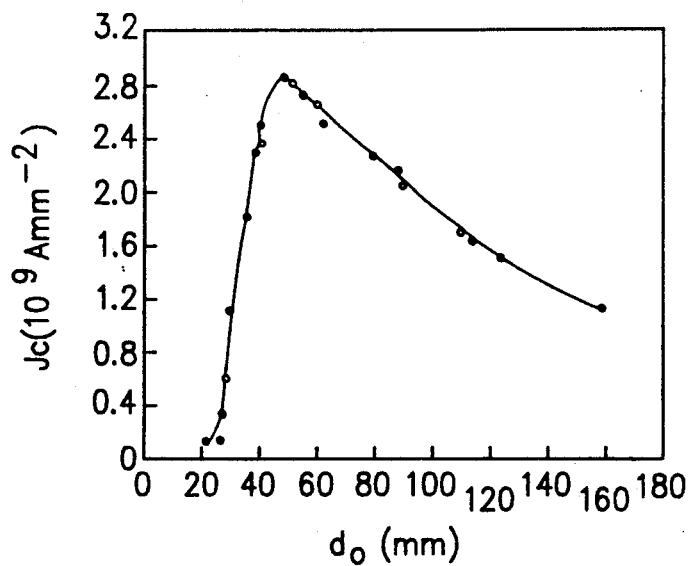
FIG. 1 is from I. Hiasnik et al., "Properties of Superconducting NbTi Superfine Filament Composites with Diameters ~ <0.1 μm", Cryogenics, vol. 25, October, 1985, showing critical current density at 5T and 4.2° K. versus NbTi filament diameter as calculated (0) and as measured experimentally (.).
Figure 2:
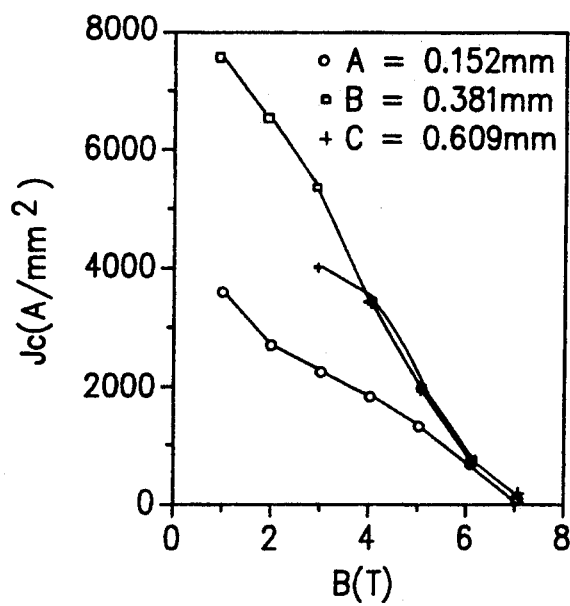
FIG. 2 is from L. R. Motowidlo, H. C. Kanithi, and B. A. Zeitlin, "NbTi Superconductors with Artificial Pinning Structures", To be published, presented as paper #HX-01 at ICMC/CEC, Los Angeles, Calif, Jul. 25, 1989, showing critical current density versus applied magnetic field for three wire sizes corresponding to NbTi dimensions of 237 A.°, 592 A.°, and 968 A.° (A, B, and C, respectively).
Figure 5:
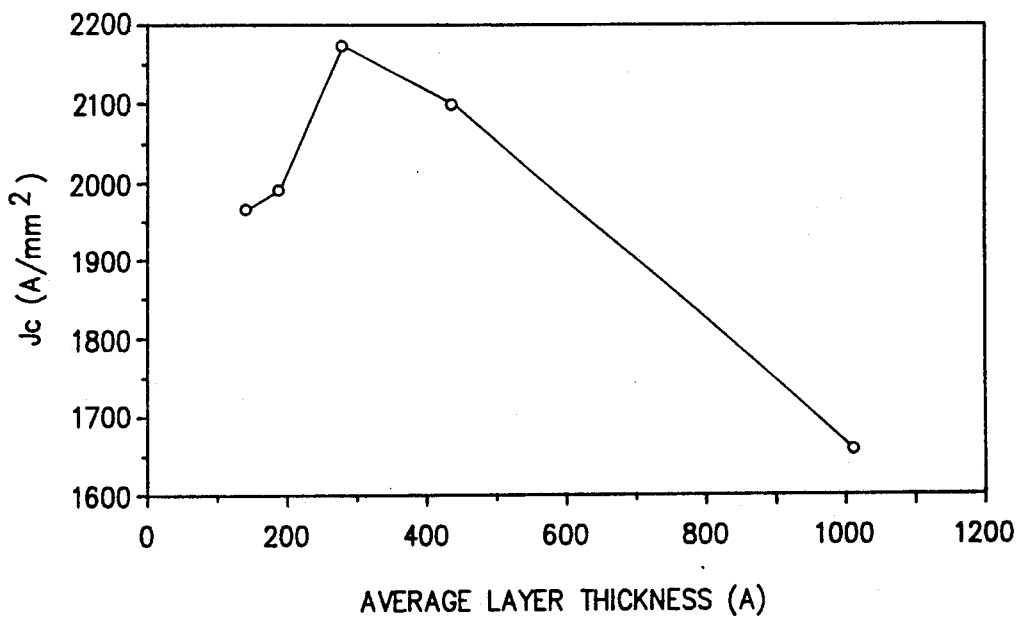
FIG. 5 shows a plot of current density versus average layer thickness for the Nb/Ti composite fabricated in accordance with the invention. The average layer thickness is the average of the Nb and Ti layer thicknesses at the testing size as extrapolated from the starting sheet thicknesses.

FIG. 5 shows a plot of $J_c$ versus the average layer thickness in the composite, that is, the average of the Nb and Ti layer thicknesses at the testing size as extrapolated from the starting sheet thicknesses (0.018" average). The peak $J_c$ occurred at between 300 A.° and 400 A.°. Note the similarity between this curve and that produced by Hiasnik et al. (FIG. 1), indicating that the same sort of pinning mechanism is at work.

Figure 6:
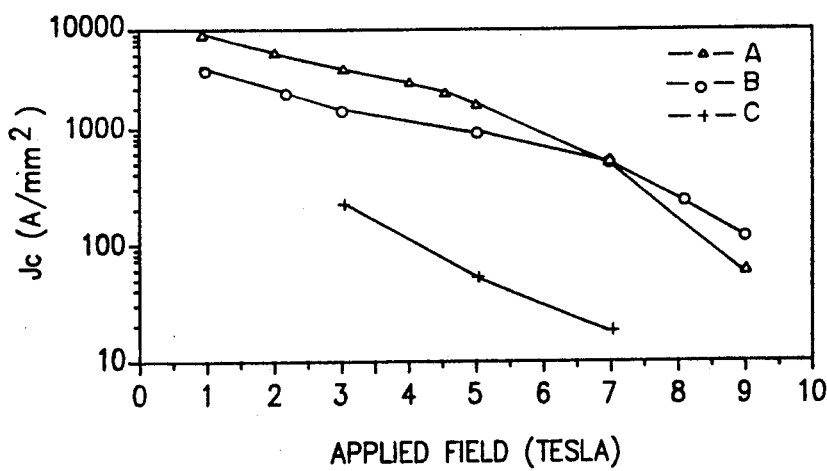
FIG. 6 shows a plot of current density versus applied magnetic field for three 0.0084" diameter samples of the composite fabricated in accordance with the invention: A) Non-heat treated; B) Heat treated (750° C., 1 hr.) at 0.0084"; C) Heat treated (730° C., 1 hr.) at 0.508" followed by drawing to 0.0084".

The application of a 750° C., 1 hour reaction heat treatment — chosen so as to prevent α-Ti formation — was found to reduce $J_c$ for wire diameters ranging for 0.508" to 0.0045". The application of a heat treatment followed by drawing to the sample size tended to increase $J_c$ at that size in the 7–9T range, but $J_c$ remained inferior over the lower field region, where pinning is most important. The plot in FIG. 6 shows these effects. The poor low field $J_c$'s observed suggests that the high temperature heat treatment tended to homogenize the material, thereby lowering the degree of pinning afforded by the Nb and Ti layers.

Figure 7:
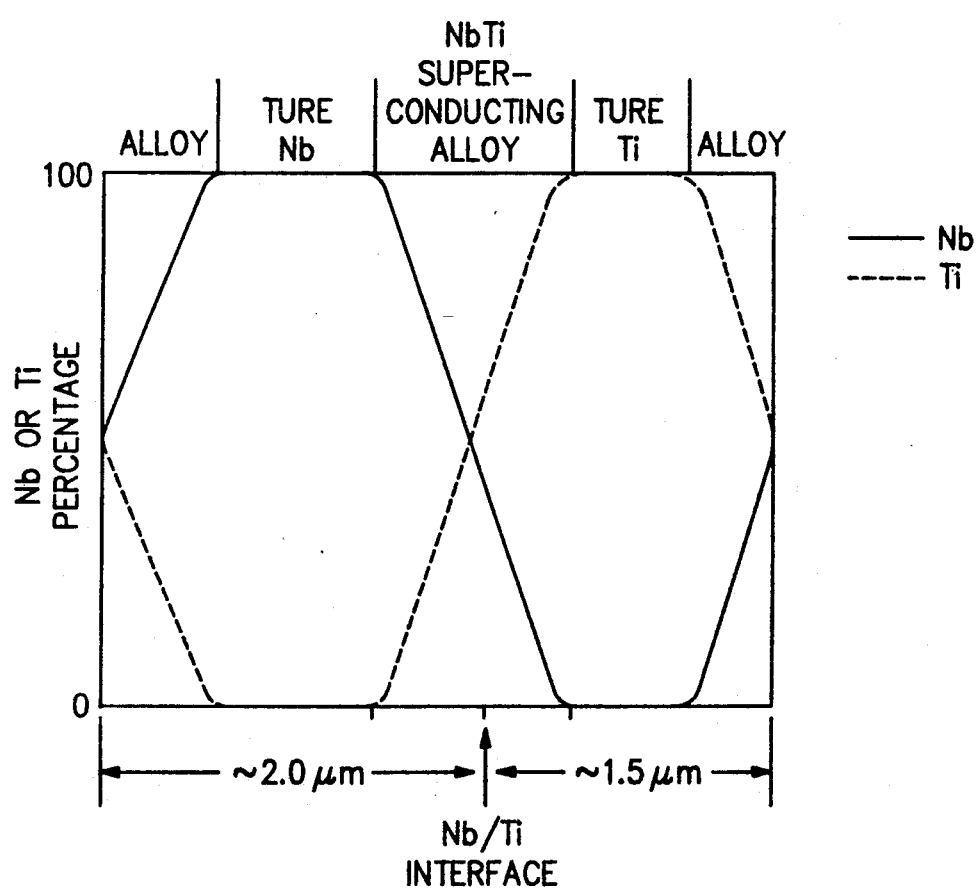
FIG. 7 is a schematic diagram representing the variations in Nb and Ti concentration in the layers of the composite manufactured in accordance with the invention.

An EDS (energy dispersive spectroscopy) examination of the composite at the 0.508" diameter extrusion size revealed that neither the Nb nor the Ti layers were completely reacted, but that significant diffusion had occurred along the Nb/Ti interfaces. This effect is shown schematically in FIG. 7, where the exact extent of the NbTi superconducting region is a matter of definition (i.e., relative to Nb and Ti concentrations). Both the Nb and Ti contribute to the flux pinning in the composite.

We claim:

1. A method for producing a superconductor comprising the steps of combining a plurality of metal layers by wrapping a plurality of said metal layers around a support to form a composite structure, said metal layers being selected from the transition metals niobium, titanium, zirconium or vanadium, alternate layers being formed of different transition metals to form pairs, reacting the transition metals to cause diffusion of at least one metal into the other metal to form a ductile superconducting alloy as a result of this diffusion, limiting the extent of the reaction so as to maintain the cross-sectional thickness of pure or nearly pure essentially undiffused transition metal along with the superconducting alloy in at least one of each pair of transition metals which is about equal to the thickness of diffused superconducting alloy, with a partially diffused zone separating each superconducting zone from each undiffused zone, mechanically reducing the composite structure and providing further diffusion to produce a superconducting layer in contact with a non superconducting layer in each said pair, each said layer being less than 1000 A.° thick.

2. The process of claim 1 which includes the step of compacting the interfaces between said layers to provide a metal-to-metal bond between said bodies prior to reacting the transition metals to form the ductile superconducting alloy.

3. The method of claim 1 wherein said composite structure is subjected to a temperature between about 400° C. and about 650° C. for a total time of between 4 and 16 hours to provide a partial diffusion zone between said layers of about 50% of the thickness thereof, said heating step being achieved before said layers have been reduced to less than 1 micron.

4. The method of claim 1 wherein the mechanical reduction is accomplished under pressure, temperature and time conditions to create a superconducting diffusion zone at each said interface which is about half as thick as each said transition metal layer.

5. The method of claim 1 wherein the mechanical reduction is accomplished under pressure, temperature and time conditions to create a superconducting diffusion zone at each said interface which is about half as thick as each said transition metal layer so that each diffusion zone is separated from the nearest adjacent diffusion zone by a thickness of the diffusion zone.

6. The method of claim 3 which includes the steps of mechanically reducing the thickness of said layers sufficiently so that each diffusion zone is less than about 500 Angstroms thick and each undiffused zone is about equal in thickness to the diffusion zone.

* * * * *

UNITED STATES PATENT AND TRADEMARK OFFICE
CERTIFICATE OF CORRECTION

PATENT NO. : 5,158,620

DATED : OCTOBER 27, 1992

INVENTOR(S) : James WONG, Mark K. RUDZIAK, and Donald W. CAPONE, III

It is certified that error appears in the above-identified patent and that said Letters Patent is hereby corrected as shown below:

Claim 1, Col. 6, Line 23, after "each", --said-- should be inserted.

Claim 5, Col. 6, Line 55, after "of", --undiffused transition metal about equal to the thickness of-- should be inserted.

Signed and Sealed this

Twenty-first Day of February, 1995

Attest:

BRUCE LEHMAN

Attesting Officer

Commissioner of Patents and Trademarks